United States Patent [19]

Nishide et al.

[11] Patent Number: 4,467,029
[45] Date of Patent: Aug. 21, 1984

[54] METHOD FOR PRODUCING A PHOTOGRAPHIC IMAGE FROM A LIPPMANN TYPE SILVER HALIDE PHOTOGRAPHIC LIGHT-SENSITIVE MATERIAL

[75] Inventors: Toshikazu Nishide; Akio Kobayashi, both of Hino; Tamio Kitahata, Musashimurayama, all of Japan

[73] Assignee: Konishiroku Photo Industry Co., Ltd., Tokyo, Japan

[21] Appl. No.: 473,222

[22] Filed: Mar. 8, 1983

[30] Foreign Application Priority Data

Mar. 18, 1982 [JP] Japan .................................. 57-43840

[51] Int. Cl.³ .......................... G03C 5/24; G03C 1/06; G03C 1/02
[52] U.S. Cl. ..................................... 430/441; 430/434; 430/445; 430/568; 430/600; 430/603
[58] Field of Search ............... 430/568, 600, 603, 611, 430/613-614, 434, 441, 445

[56] References Cited

U.S. PATENT DOCUMENTS 4,108,661 8/1978 Vanassche et al. ................. 430/568
4,202,695 5/1980 Philippaerts et al. .............. 430/568
4,379,837 4/1983 Lapp et al. .......................... 430/568

Primary Examiner—Mary F. Downey
Attorney, Agent, or Firm—Frishauf, Holtz, Goodman & Woodward

[57] ABSTRACT

A silver halide light-sensitive photographic material comprises a support and a Lippmann emulsion layer on the support containing a silver halide and at least one compound of the following formula in a quantity of at least $3.5 \times 10^{-3}$ mole per mole of the silver halide of the Lippmann emulsion layer:

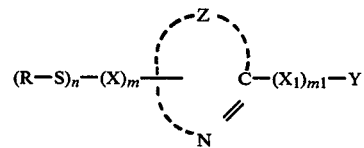

wherein Z represents an atomic group necessary to form a heterocyclic ring; Y is a hydrogen atom or $-S-R_1$ group; R and $R_1$ are each a hydrogen atom, an alkali-metal atom, ammonium or an alkyl group; X and $X_1$ are each a divalent organic group; m and $m_1$ are each 0 or 1; and n is an integer of up to 3, provided if n is 0, Y is $-S-R_1$ group.

The silver halide light-sensitive photographic material is developed in a developer containing at least 0.6 mole per liter of sulfurous ions.

18 Claims, No Drawings

METHOD FOR PRODUCING A PHOTOGRAPHIC IMAGE FROM A LIPPMANN TYPE SILVER HALIDE PHOTOGRAPHIC LIGHT-SENSITIVE MATERIAL

The present invention relates to a method for producing photographic images from Lippmann type silver halide photographic light-sensitive material, and more particularly to a method that provides excellent reproduction of an original image as well as excellent image density.

The Lippman emulsion whose average silver halide particle size is normally not more than 100 nm is an important material in the photographic field, particularly in production of high-resolution photographic plate or film, in microphotography, in recording of nuclear-physical phenomena, in production of masks for microelectronic integrated circuits, in high-density data storage in the holographic process, and the like.

In production of microelectronic integrated circuits, an enlarged drawing of various continual masks necessary for producing a unit of integrated circuits is prepared, and the drawing is then reduced, if necessary, in successive processes and reproduced on a Lippmann plate or film to form a mask for integrated circuits. The thus formed mask image, by various photographic and chemical process deleted, is transferred onto a surface on which integrated circuits are formed to produce a required circuit element.

A photographic light-sensitive material for use in production of such a mask should have high resolution and precision and must provide dimensionally accurate reproduction.

However, the known Lippman type silver halide photographic light-sensitive material having on the support thereof a high-resolution Lippmann emulsion layer encounters special problems such as those described below when processed in a developer containing at least 0.6 mole/liter of sulfurous acid ions.

Namely, the image density produced by processing in the above-described developer is low, and the use of such a low density-having image makes it very difficult to print a mask pattern on a silicone wafer. The image obtained by processing in the above developer is inferior in sharpness when compared with the original image, causing the edge portions of the image to be rounded, and also inferior in production of line widths, resulting in the printed lines being narrower than those of the original.

Such phenomena are observed in the case of processing Lippmann type silver halide photographic light-sensitive material in a developer containing at least 0.6 mole/liter of sulfurous acid ions. Even in the case of the above developer, if a photographic light-sensitive material having silver halide particles of a larger size than that mentioned earlier is processed or if a developer containing sulfurous acid ions in a quantity of less than 0.6 mole/liter is used to process the Lippmann type silver halide photographic light-sensitive material, the above-mentioned phenomena cannot occur. Accordingly, it has been found that the above-mentioned drawbacks are brought about only when a silver halide photographic light-sensitive material having such fine-grained silver halide particles as of the Lippmann type silver halide photographic light-sensitive material is processed in a developer containing at least 0.6 mole/liter of sulfurous acid ions.

It is an object of the present invention to provide an improved method for producing a photographic image from a Lippmann type silver halide photographic light-sensitive material (hereinafter referred to as Lippmann light-sensitive material) which proved satisfactory image density and satisfactory reproduction of the original image even when being processed in a developer containing at least 0.6 mole/liter of sulfurous acid ions.

We have found that the above-described object of the present invention can be accomplished by incorporating into a Lippmann emulsion layer at least one compound having the following formula I in a quantity of at least $3.5 \times 10^{-3}$ mole per mole of the silver halide contained in the Lippmann emulsion layer:

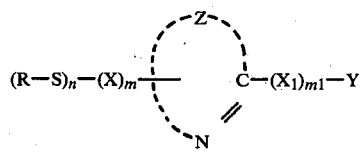

Formula I wherein Z represents an atomic group necessary to form a heterocyclic ring; Y is hydrogen or the $-S-R_1$ group; R and $R_1$ are each hydrogen, an alkali metallic atom, ammonium or an alkyl group; X and $X_1$ are each a divalent organic group; m and $m_1$ are each an integer of 0 or 1; and n is an integer up to 3, provided when n is 0, Y is $-S-R_1$ group.

The heterocyclic ring in Formula I includes rings having a condensed ring therein specifically imidazole, imidazoline, benzimidazole, thiazole, thiazoline, benzthiazole, oxazole, benzoxazole, selenazole, benzoselenazole, quinoline, pyrimidine, pyrazine, pyridazine, thiadiazole, oxadiazole, triazole, tetrazole, and the like. These rings include those having at least one of the substituents such as an alkyl group (methyl, ethyl, etc.); an aryl group (octyl-phenyl etc.); hydroxyl group, carboxyl group, sulfonic group, and alkali metal thereof; an alkoxy group (methoxy, ethoxy, etc.) a carboxy ester group; a nitro group; a halogen atom (chlorine etc.) and an amino group. Further, these heterocyclic rings include those wherein two heterocyclic rings are joined together through a divalent group such as an alkylene group.

The alkali-metal atom represented by each of R and $R_1$ in Formula I is, e.g., a sodium atom, a potassium atom, etc. The alkyl group is e.g., a lower alkyl group such as methyl, ethyl, butyl, etc. and includes those having a substituent such as a carboxyl group, an alkali-metal thereof, an acyl group, an alkoxy group, or the like.

The divalent organic group represented by each of X and $X_1$ in Formula I is preferably an alkylene such as ethylene.

The following are examples of the compounds having Formula I of the present invention, but the compounds applicable to the present invention are not limited to the following examples:

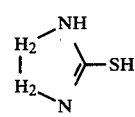

1.

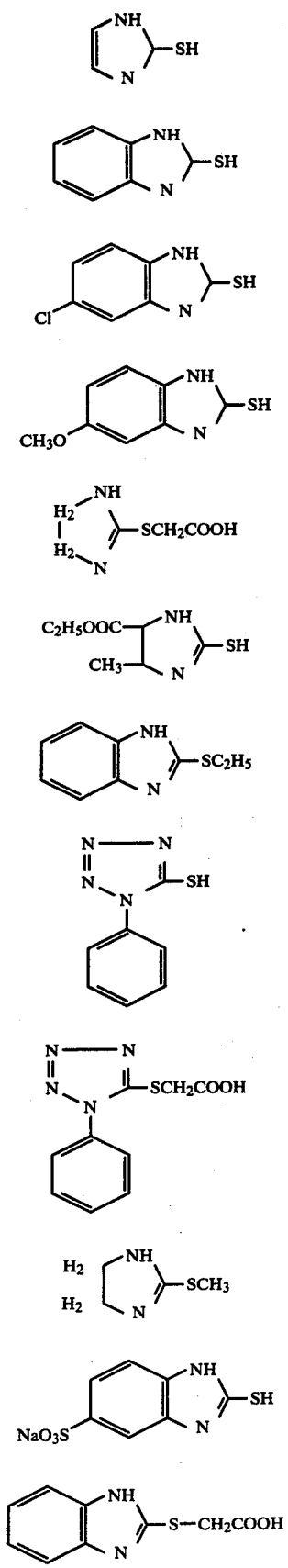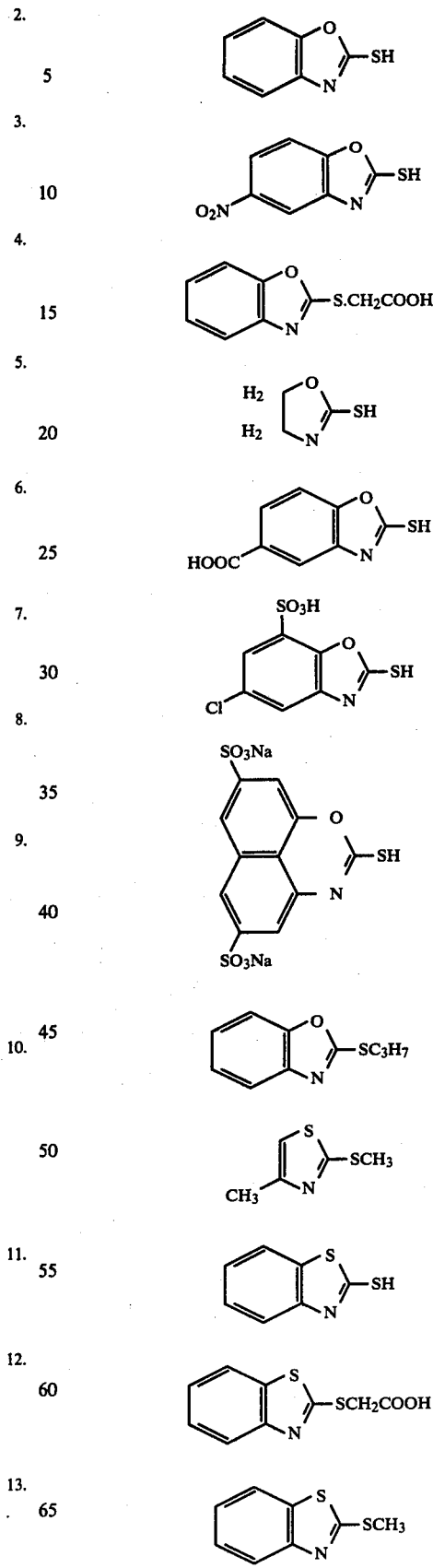

-continued
26. 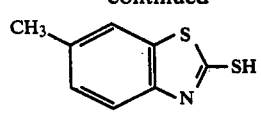
27. 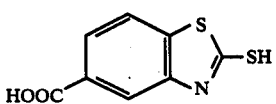
28. 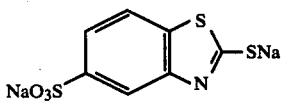
29. 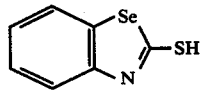
30. 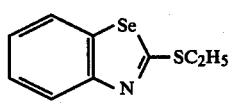
31. 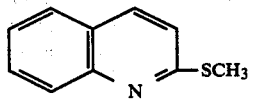
32. 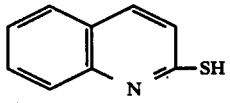
33. 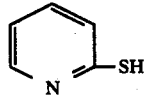
34. 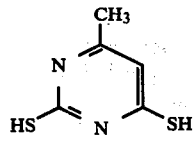
35. 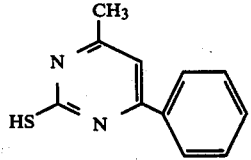
36. 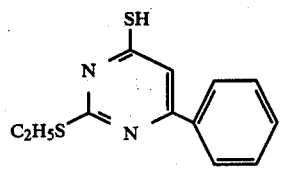
37. 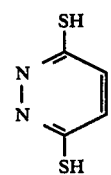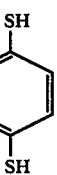
-continued
38. 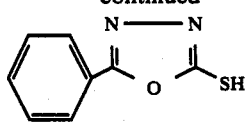
39. 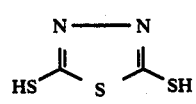
40. 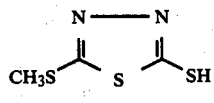
41. 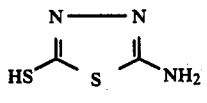
42. 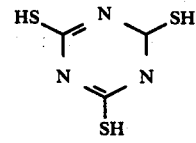
43. 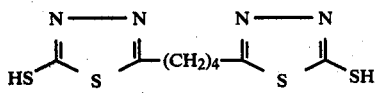
44. 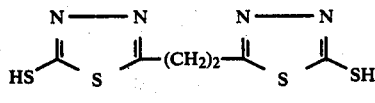
45. 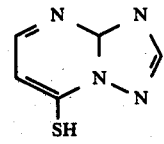
46. 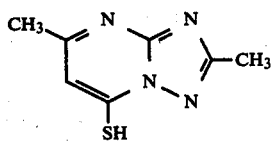
47. 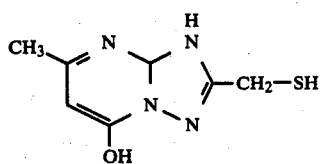
48. 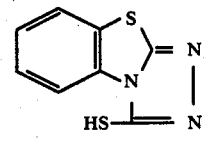
49. 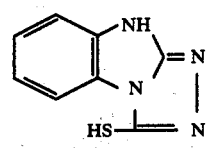
The preferred compounds are those having the Formula II:

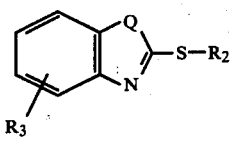

Formula II wherein Q is a sulfur atom, selenium atom or —NH— radical; $R_2$ is the same definition as $R_1$ in Formula I; and $R_3$ is a radical selected from the group consisting of a hydrogen atom, an alkyl group such as methyl and ethyl, an aryl group such as phenyl, hydroxyl group, carboxyl group, sulfonic acid group, an alkoxy group such as methoxy and ethoxy, a carboxy ester group, a nitro and a halogen atom.

The quantity of the above compounds is required to be at least $3.5 \times 10^{-3}$ mole per mole of the silver halide of the Lippmann emulsion layer.

If the quantity of the above compounds is less than $3.5 \times 10^{-3}$ mole, the object of the present invention is not accomplished when the material is processed in a developer containing at least 0.6 mole/liter of sulfurous acid ions.

In addition, the appropriate quantity range of the above compounds is practically up to the extent of $3.5 \times 10^{-2}$ mole per mole of the silver halide, taking into account the production cost or possible deterioration of the characteristics of the emulsion.

The above compound is dissolved in a solvent such as methanol, ethanol, a mixture of water with methanol, or the like, to be added to the Lippmann emulsion.

The developer containing at least 0.6 mole/liter of sulfurous acid ions, for use in the development of the Lippmann light-sensitive material of the present invention, is used in a negative-image development process to obtain a negative image or in the first development (negative-image development) of a reversal development process. The maximum practical amount of the sulfurous ion content of the developer used in the present invention is up to 1.5 moles/liter.

The negative-image development process consists of (1) development, (2) stopping, (3) fixing, and (4) washing.

The reversal development process basically consists of the following steps: (1) first development, (2) stopping, (3) bleaching, (4) clearing, (5) second exposure, (6) second development, (7) fixing, (8) washing or clearing, (9) washing, and (10) drying. Depending on the specific process, at least one of the steps (2), (7) and (9) may be omitted. A washing step may be interposed between the above steps.

When using the Lippmann light-sensitive material of the present invention in the reversal development process, the exposed Lippmann light-sensitive material is developed to obtain a negative image; the silver image developed by the first development, the so-called "first development," is oxidized to be removed by a bleaching bath, and then the remaining silver halide is developed, which development step is called the second development. The developer for use in the first and second development in the above reversal development process and in the negative development process is an alkaline aqueous solution containing a developing agent which is well-known to those skilled in the art, including dihydroxybenzenes such as, e.g., hydroquinone, chlorohydroquinone, bromohydroquinone, isopropyl hydroquinone, methyl hydroquinone, 2,3-dichlorohydroquinone, 2,5-dimethyl hydroquinone, and the like; 3-pyrazolidones such as, e.g., 1-phenyl-3-pyrazolidone, 1-phenyl-4-methyl-3-pyrazolidone, 1-phenyl-4,4-dimethyl-3-pyrazolidone, 1-phenyl-4-ethyl-3-pyrazolidone, 1-phenyl-5-methyl-3-pyrazolidone, and the like; aminophenols such as o-aminophenol, p-aminophenol, N-methyl-o-aminophenol, N-methyl-p-aminophenol, 2,4-diaminophenol, and the like; pyrogallol; ascorbic acid; 1-aryl-3-aminopyrazolines such as 1-(p-hydroxyphenyl)-3-aminopyrazoline, 1-(p-methyl-aminophenol)-3-aminopyrazoline, 1-(p-amino-m-methyl-phenyl)-3-aminopyrazoline, and the like; p-phenylenediamines such as. e.g., 4-amino-N,N-diethyl-aniline, 3-methyl-4-amino-N,N-diethyl-aniline, 4-amino-N-ethyl-N-βhydroxyethyl-aniline, 3-methyl-4-amino-N-ethyl-N-β-methane-sulfonamidoethyl-aniline, 4-amino-3-methyl-N-ethyl-N-β-methoxyethyl-aniline, and the like, or mixtures of some of these compounds.

The developer may also contain a preservative such as a sulfite, a hydrogen sulfite, etc.; a buffer such as a carbonate, boric acid, a borate, a phosphate, an alkanolamine, etc.; an alkaline agent such as a hydroxide, a carbonate, a phosphate, etc.; a dissolving aid such as a polyethylene glycol, an ester thereof, etc.; a pH control agent such as acetic acid; a sensitizer such as a quaternary ammonium salt; a development accelerator, a surface active agent, an antifoggant such as potassium bromide, sodium bromide, benzotriazole, benzothiazole, tetrazole, thiazole, etc.; a chelating agent such as a polycarboxylic acid, e.g., ethylenediamine tetracetic acid or a salt thereof, a polyphosphate, etc.; and the like.

The thickness of the Lippmann emulsion layer of the present invention is normally from about $3\mu$ to about $8\mu$. The average grain size of the silver halide particles therein is normally not more than 100 nm. The ratio between the silver halide and the hydrophilic colloid in the above emulsion layer is preferably 1:3, and at most 4:1. The Lippmann emulsion may be prepared as described in the "Photographic Chemistry" written by Glafkides, Vol. 1 (1958) p.p. 365–368; "The Theory of the Photographic Process" (1966) written by Mees & James, p. 36; the "Note of Applied Science" No. 20, edited by the National Physical Laboratory; and the "Small-Scale Preparation of Fine-Grain (Colloidal) Photographic Emulsion" written by B. H. Clawford, London, 1960. The emulsion may also be prepared in the manner described in British patent application No. 15948/70.

The Lippmann emulsion having extremely fine particles may be obtained by precipitating a silver halide in the presence of a heterocyclic mercapto compound as described in British Pat. No. 1,204,623 or in the presence of a compound as described in British patent application Nos. 53025/69 and 54539/69.

The hydrophilic colloid to be used as the vehicle for the silver halide may be any of those hydrophilic colloids usually used in photographic light-sensitive emulsions, e.g., gelatin, albumin, zein, casein, alginic acid, carboxymethyl cellulose, polyvinyl alcohols, poly-N-vinyl pyrolidone, and the like.

The silver halide of the Lippmann emulsion may be, e.g., silver chloride, silver bromide, silver iodide, silver chlorobromide, silver iodobromide, silver chloroiodobromide, or the like. Silver iodobromide having an average particle size of not more than 100 nm and which contains at most 8 mole % silver iodide is preferred.

The above Lippmann emulsion may be chemically or optically sensitized. When sensitizing optically, a known spectral such as cyanine, merocyanine, or the like may be used.

The silver halide emulsion of the present invention for use in the production of a microelectronic mask is sensitized most advantageously to the green region of spectrum. For exposure, a light source that is capable of emitting a light of the wavelength in the spectrally sensitized region should be selected.

The above Lippmann emulsion may be chemically sensitized by subjecting the emulsion to a ripening treatment in the presence of a compound containing a slight amount of sulfur such as an arylthiocyanate, an aryl-thiourea, sodium thiosulfate, or the like. The emulsion may also be chemically sensitized by use of a sensitizer such as one of those tin compounds as described in, e.g., French Pat. No. 1,146,955, Belgian Pat. No. 568,687, iminoaminomethane-sulfinic compounds as described in British Pat. No. 789,823, or a small amount of a noble metal compound such as gold, platinum, palladium, iridium, ruthenium or rhodium.

Further, into the above emulsion may be incorporated a compound capable of accelerating the development to thereby increase the sensitivity of the emulsion. Compounds of this kind include, e.g., polyoxyalkylene compounds such as alkylene-oxide condensation products and quaternary ammonium, quaternary phosphonium and tertiary sulfonium compounds as described in U.S. Pat. Nos. 2,531,832 and 2,533,990, British Pat. Nos. 920,637, 940,051, 945,340 and 991,608, and Belgian Pat. No. 648,710 as well as onium derivatives of amino-N-oxide as described in British Pat. No. 1,121,696.

The above emulsion may also contain a stabilizer such as hydroxytriazolopyridine type compounds, and further may be stabilized by those compounds described in Belgian Pat. Nos. 524,121 and 677,337, British Pat. No. 1,173,609, and U.S. Pat. No. 3,179,520.

And the above emulsion, in order to reduce the scattering and reflection of light inside the light-sensitive material, may also contain a light-absorbing dye selected to absorb light of the same wavelength as the light used in the exposure of the light-sensitive material. Details of such dyes are described in Belgian Pat. No. 699,375, British patent application No. 58844/68, and the like. These dyes are desirably used in a quantity so as to provide a density of from 0.05 to 0.20 when measured on an emulsion layer having a thickness of $1\mu$ in the spectral region of the light source used in the exposure of the light-sensitive material.

Furthermore, to the above emulsion may be added additives including a hydrophilic-colloidal hardener such as chromium salts, aluminum salts, zirconium salt, formaldehyde, dialdehyde, hydroxyaldehyde, acrolein, glyoxal; halogen-substituted aldehyde acids such as mucochloric acid and mucobromic acid; diketones such as divinyl ketone; compounds having not less than one vinyl-sulfonyl radical such as divinyl sulfone, 1,3,5-trivinyl-sulfonyl benzene, vinyl-carbonyl; halogenoacetyl and/or acyl radical-having hexahydro-1,3,5-triazine such as 1,3,5-triacryloyl-hexahydro-1,3,5-triazine, 1,3-diacryloyl-5-acetyl-hexahydro-1,3,5-triazine, 1,3,5-trichloroacetyl-hexahydro-1,3,5-triazine, and the like.

In order to better the adhesion of the emulsion to a glass support in the production of a high-resolution plate material, to the emulsion may be added a silicon compound such as described in British patent application No. 54678/68, and in addition, if necessary, all other kinds of additives such as a plasticizer, coating aid, and the like.

The above Lippmann emulsion may be coated on various kinds of support. Typical examples of the support include cellulose ester film, polyvinyl-acetal film, polystyrene film, polyethylene terephthalate film, paper, glass, and the like. In the production of a high-resolution plate material for use in the manufacture of masks to be used in electronic industries, a glass support is most advantageously used because of its high dimensional stability.

As the component layers of the Lippmann light-sensitive material, in addition to the foregoing Lippmann emulsion layer, the light-sensitive material may be provided with such auxiliary layers as a subbing layer to secure the adhesion of the emulsion layer to the support, a protective layer to prevent the emulsion from being damaged, an antihalation layer, and the like.

The component layers in the present invention may be coated on the support by known means, such as giessor coating process, air-doctor coating process, air-curtain coating process, and the like.

The present invention is illustrated with reference to the following examples, but the embodiments of the present invention are not limited thereto.

EXAMPLE 1

To a 10% aqueous gelatin solution were added concurrently an aqueous silver nitrate solution and an aqueous solution of potassium bromide and potassium iodide to prepare a silver iodobromide emulsion (gelatin concentration: 9%) containing 3 mole % silver iodide. The precipitating condition was controlled so that a Lippmann emulsion having an average particle size of 60 nm was obtained.

The resulting emulsion was spectrally sensitized by the addition of merocyanine dye in the quantity of 250 mg per 100 g of the silver halide, whereby a strong spectral sensitization of the emulsion in the wavelength region of 500 to 550 nm was provided.

The thus obtained emulsion was divided into 10 equal parts, and to each part was added an exemplified compound of the present invention as shown in Table 1.

TABLE 1

| Sample No. | Exemplified compound (No.) of the present invention | Adding quantity ($\times 10^{-3}$ mole per mole of silver halide) |
|---|---|---|
| 1 | — | — |
| 2 | 12 | 1.1 |
| 3 | 12 | 4.3 |
| 4 | 12 | 6.5 |
| 5 | 15 | 2.2 |
| 6 | 15 | 4.7 |
| 7 | 15 | 5.6 |
| 8 | 23 | 1.3 |
| 9 | 23 | 3.7 |
| 10 | 23 | 4.5 |

The sensitized emulsion was coated on a glass plate in a thickness of $5\mu$ after drying. The amount of silver in the coating was 20 mg/dm$^2$.

Each of these samples was uniformly exposed to light. After exposure, each sample was subjected to a negative-image development in developers (Developer-A and Developer-B) having the following compositions, and then stopped, fixed and washed in the conventional manner.

Developer-A (containing not less than 0.6 mole/liter of sulfurous acid ions)

| Hydroquinone | 4 g |
| --- | --- |
| Monomethyl-p-aminophenol sulfate | 0.5 g |
| Anhydrous sodium sulfite | 120 g (0.95 mole) |
| Sodium carbonate | 30 g |
| Potassium bromide | 0.5 g |
| Water to make 1 liter | |

Developer-B (containing less than 0.6 mole/liter of sulfurous acid ions)

| Hydroquinone | 5 g |
| --- | --- |
| Monomethyl-p-aminophenol sulfate | 1 g |
| Anhydrous sodium sulfite | 40 g (0.32 mole) |
| Sodium carbonate | 30 g |
| Potassium bromide | 0.5 g |
| Water to make 1 liter | |

The image density of each sample was measured by use of a SAKURA PDA-65 densitometer (manufactured by Konishiroku Photo Industry Co., Ltd.). The results are as shown in Table 2.

TABLE 2

| Sample No. | Developer-A | Developer-B |
| --- | --- | --- |
| 1 | 2.02 | 3.45 |
| 2 | 2.31 | 3.42 |
| 3 | 3.32 | 3.43 |
| 4 | 3.40 | 3.46 |
| 5 | 2.28 | 3.45 |
| 6 | 3.38 | 3.41 |
| 7 | 3.43 | 3.47 |
| 8 | 2.33 | 3.43 |
| 9 | 3.39 | 3.44 |
| 10 | 3.44 | 3.46 |

As shown in Table 2, sample No. 1 that was processed in Developer-A whose sulfurous acid ion concentration is not less than 0.6 mole/liter reported a much smaller density than the density of the same sample that was processed in Developer-B whose sulfurous acid ion concentration is less than 0.6 mole/liter. However, the densities of samples numbered 3, 4, 6, 7, 9 and 10 containing exemplified compounds Nos. 12, 15 and 23 of the present invention in quantities of not less than $3.5 \times 10^{-3}$ moles per mole of the silver halide, processed in Developer-A, are about as high as the densities obtained by processing in Developer-B.

EXAMPLE 2

The samples that were prepared in Example 1 were exposed to a green monochromatic light under the same condition as in Example 1.

This exposure was made through a test pattern that is usually used for the quantitative evaluation of materials intended for use in the formation of microelectronic masks, the pattern consisting of groups of lines each being separated from another by spacing the same dimension as the line width, both line widths and spacings in the respective groups being designed so as to vary from 1 to 20μ. These exposed samples were processed in the same manner as in Example 1.

The images of samples Nos. 3, 4, 6, 7, 9 and 10 containing Exemplified Compounds of the present invention Nos. 12, 15 and 23 in quantities of not less than $3.5 \times 10^{-3}$ mole per mole of the silver halide show high densities in the processing in both Developer-A and Developer-B and have excellent sharpness. However, the images, obtained by processing in Developer-A, of samples No. 1 that contains no compound of the present invention and of samples Nos. 2, 5 and 8 that contain Exemplified Compounds of the present invention Nos. 12, 15 and 23, respectively, in quantities of less than $3.5 \times 10^{-3}$ mole per mole of the silver halide show small densities and poor sharpness as compared to the densities and the sharpness of the same samples that were processed in Developer-B.

EXAMPLE 3

Samples were prepared in the same manner as in Example 1 with the exception that the Exemplified compounds used and the amounts thereof are reported in Table 3.

TABLE 3

| Sample No. | Exemplified compound (No.) of the invention | Adding quantity ($\times 10^{-3}$ mole per mole of silver halide) |
| --- | --- | --- |
| 11 | — | — |
| 12 | 25 | 1.5 |
| 13 | 25 | 4.0 |
| 14 | 25 | 4.8 |
| 15 | 29 | 3.0 |
| 16 | 29 | 4.2 |
| 17 | 29 | 5.0 |
| 18 | 30 | 2.0 |
| 19 | 30 | 3.7 |
| 20 | 30 | 4.5 |

These samples were processed and then the densities were measured in the same manner as in Example 1. The results are as shown in Table 4.

TABLE 4

| Sample No. | Developer-A | Developer-B |
| --- | --- | --- |
| 11 | 2.01 | 3.43 |
| 12 | 2.35 | 3.42 |
| 13 | 3.34 | 3.44 |
| 14 | 3.42 | 3.42 |
| 15 | 2.26 | 3.46 |
| 16 | 3.39 | 3.47 |
| 17 | 3.38 | 3.41 |
| 18 | 2.31 | 3.43 |
| 19 | 3.40 | 3.42 |
| 20 | 3.41 | 3.44 |

As reported in Table 4, sample No. 11 that was processed in Developer-A whose sulfurous acid ion concentration is not less than 0.6 mole/liter shows smaller density than the density of the same sample that was processed in Developer-B whose sulfurous acid ion concentration is less than 0.6 mole/liter. However, the densities, obtained by processing in Developer-A, of samples Nos. 13, 14, 16, 17, 19 and 20 that contain exemplified compounds of the present invention Nos. 25, 29 and 30 in quantities of not less than $3.5 \times 10^{-3}$ mole per mole of the silver halide are about as high as those of the same samples that were processed in Developer-B.

EXAMPLE 4

The samples that were prepared in Example 3 were exposed in the same manner as in Example 2 and then processed. The images of sample Nos. 13, 14, 16, 17, 19 and 20 that contain Exemplified compounds of the present invention Nos. 25, 29 and 30 in quantities of not less than $3.5 \times 10^{-3}$ moles per mole of the silver halide show high densities and have excellent sharpness when processed in both Developer-A and Developer-B. However, the images, obtained by processing in Developer-A, of sample No. 11 that does not contain a compound of the present invention and of samples Nos. 12, 15 and 18 that contain Exemplified compounds Nos. 25, 29 and 30, respectively, in quantities of less than $3.5 \times 10^{-3}$ moles per mole of the silver halide show small densities and have poor sharpness as compared to the densities and the sharpness of the same samples that were processed in Developer-B.

EXAMPLE 5

The samples which were prepared in Example 1 and Example 3 were exposed uniformly to light. After exposure, each of the exposed samples was processed in accordance with the following steps for the reversal development process.

| Processing steps: | | |
|---|---|---|
| (1) 1st development | at 20° C. | 5 minutes |
| (2) Washing | at 18 to 21° C. | 2 minutes |
| (3) Bleaching | at 18 to 21° C. | 2 minutes |
| (4) Washing | at 18 to 21° C. | 2 minutes |
| (5) Clearing | at 20° C. | 5 minutes |
| (6) Washing | at 18 to 21° C. | 2 minutes |
| (7) 2nd exposure | Overall exposure | |
| (8) 2nd development | at 20° C. | 5 minutes |
| (9) Washing | at 18 to 21° C. | 5 minutes |
| (10) Drying | | |

The compositions of the processing liquids are as follows:

| 1st developing bath: | |
|---|---|
| Hydroquinone | 40 g |
| Anhydrous sodium sulfite | 100 g (0.79 mole) |
| Sodium hydroxide | 45 g |
| Potassium bromide | 40 g |
| Water to make 1 liter | |
| Bleaching bath: | |
| Potassium dichromate | 20 g |
| Concentrated sulfuric acid | 15 ml |
| Water to make 1 liter | |
| Clearing bath: | |
| Anhydrous sodium sulfite | 30 g |
| Water to make 1 liter | |
| 2nd developing bath: | |
| Hydroquinone | 5 g |
| Monomethyl-p-aminophenol sulfate | 1 g |
| Anhydrous sodium sulfite | 40 g (0.32 mole) |
| Sodium carbonate | 30 g |
| Potassium bromide | 0.5 g |
| Water to make 1 liter | |

After processing, the density of each sample was measured by use of a SAKURA PDA-65 densitometer (manufactured by Konishiroku Photo Industry Co., Ltd.). The results are as shown in Table 5.

TABLE 5

| Sample No. | Density |
|---|---|
| 1 | 1.51 |
| 2 | 1.82 |
| 3 | 3.03 |
| 4 | 3.10 |
| 5 | 1.72 |
| 6 | 2.95 |
| 7 | 2.99 |
| 8 | 1.66 |
| 9 | 3.01 |
| 10 | 2.97 |
| 11 | 1.52 |
| 12 | 2.01 |
| 13 | 2.99 |
| 14 | 3.03 |
| 15 | 1.96 |

TABLE 5-continued

| Sample No. | Density |
|---|---|
| 16 | 3.02 |
| 17 | 3.03 |
| 18 | 1.94 |
| 19 | 2.97 |
| 20 | 3.01 |

As seen from Table 5, samples Nos. 3, 4, 6, 7, 9, 10, 13, 14, 16, 17, 19 and 20 which contain Exemplified Compounds of the present invention in quantities of not less than $3.5 \times 10^{-3}$ moles per mole of the silver halide show high densities.

EXAMPLE 6

The samples which were obtained in Example 5 were exposed to light under the same condition as in Example 2, and then processed under the same conditions as in Example 5. As the result, samples Nos. 3, 4, 6, 7, 9, 10, 13, 14, 16, 17, 19 and 20 which contain Exemplified Compounds of the present invention in quantities of not less than $3.5 \times 10^{-3}$ moles per mole of the silver halide show high image densities, excellent sharpness, and excellent reproducibilities of the original image.

However, the images of samples Nos. 1 and 11 that do not contain compounds of the present invention and of samples Nos. 2, 5, 8, 12, 15 and 18 which contain Exemplified Compounds of the present invention in quantities of less than $3.5 \times 10^{-3}$ moles per mole of the silver halide show small densities and poor sharpness.

What is claimed is:

1. A method for producing a photographic image from an imagewise exposed silver halide light-sensitive photographic material, said material comprises a support and a Lippmann emulsion layer on said support containing a silver halide and at least one compound of the following formula I in a quantity of at least $3.5 \times 10^{-3}$ mole per mole of said silver halide of said Lippmann emulsion layer:

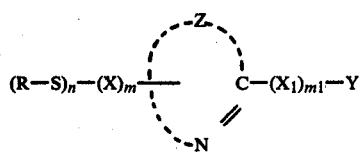

Formula I wherein Z represents an atomic group necessary to form a substituted or unsubstituted heterocyclic ring; Y is a hydrogen atom or $-S-R_1$ group; R and $R_1$ are each a hydrogen atom, an alkali-metal atom, ammonium or an alkyl group; X and $X_1$ are each a divalent organic group; m and $m_1$ are each 0 or 1; and n is an integer of up to 3, provided if n is 0, Y is $-S-R_1$ group;

comprising developing said material in a developer containing at least 0.6 mole per liter of sulfurous ions.

2. The method of claim 1, wherein said heterocyclic ring is selected from the group consisting of imidazole, imidazoline, benzimidazole, thiazole, thiazoline, benzthiazole, oxazole, benzoxazole, selenazole, benzoselenazole, quinoline, pyrimidine, pyrazine, pyridazine, thiadiazole, oxadiazole, triazole and tetrazole.

3. The method of claim 1, wherein said alkali-metal atom is selected from sodium atom and potassium atom.

4. The method of claim 1, wherein said alkyl group is a lower alkyl group.

5. The method of claim 1, wherein said divalent organic radical is an alkylene.

6. The method of claim 1, wherein said compound of the formula I is a compound having the following formula II:

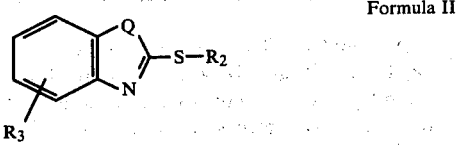

Formula II wherein Q is a sulfur atom, selenium atom or —NH— radical; $R_2$ is selected from the group consisting of a hydrogen atom, an alkali-metal atom, ammonium and an alkyl group; $R_3$ is a radical selected from the group consisting of a hydrogen atom, an alkyl group, an aryl group, hydroxyl, carboxyl, sulfonic acid, an alkoxy group, a carboxy ester group, a nitro and a halogen atom.

7. The method of claim 1 or 6, wherein the average grain size of said silver halide of said Lippmann emulsion layer is not more than 100 nm.

8. The method of claim 1 or 6, wherein said Lippmann emulsion layer further comprises a hydrophilic colloid.

9. The method of claim 8, wherein said silver halide and said hydrophilic colloid are in a ratio of between 1:3 and 4:1.

10. The method of claim 1 or 6, wherein said silver halide of said Lippmann emulsion layer is at least one halide selected from the group consisting of silver chloride, silver bromide, silver iodide, silver chlorobromide, silver iodobromide and silver chloroiodobromide.

11. The method of claim 1 or 6, wherein said silver halide of said Lippmann emulsion layer comprises silver iodobromide containing less than 8 mole % silver iodide and having the average grain size of not more than 100 nm.

12. The method of claim 1 or 6, wherein said Lippmann emulsion layer is spectrally sensitized to the green region of spectrum.

13. The method of claim 12, wherein said support is a glass support.

14. The method of claim 13, wherein said Lippmann emulsion layer further comprises a silicon compound.

15. The method of claim 13, wherein said Lippmann emulsion layer comprises a merocyanine dye.

16. The method of claim 1 wherein said developer contains 0.6—1.5 mole of sulfurous ions.

17. The method of claim 1, wherein said developer is a negative type developer.

18. The method of claim 17, wherein said developer comprises a dihydroxy-benzene.

* * * * *